(12) United States Patent  
Nakadate

(10) Patent No.: US 7,648,729 B2
(45) Date of Patent: Jan. 19, 2010

(54) MASK, METHOD OF MANUFACTURING MASK, DEVICE FOR MANUFACTURING MASK, METHOD OF MANUFACTURING LAYER OF LUMINESCENT MATERIAL, ELECTRO-OPTICAL DEVICE, AND ELECTRONIC DEVICE

(75) Inventor: Makoto Nakadate, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 1110 days.

(21) Appl. No.: 10/782,947

(22) Filed: Feb. 23, 2004

(65) Prior Publication Data

US 2005/0053764 A1    Mar. 10, 2005

(30) Foreign Application Priority Data

| Mar. 7, 2003 | (JP) | ............................. 2003-061355 |
| Mar. 7, 2003 | (JP) | ............................. 2003-061356 |
| Mar. 7, 2003 | (JP) | ............................. 2003-061357 |
| Feb. 13, 2004 | (JP) | ............................. 2004-036621 |

(51) Int. Cl.
*B05D 5/06* (2006.01)

(52) U.S. Cl. ............................. 427/64; 427/66; 427/71; 427/78; 427/97.2

(58) Field of Classification Search .................. 427/64, 427/66, 71, 78, 97.2

See application file for complete search history.

(56) References Cited

U.S. PATENT DOCUMENTS

| 6,603,159 B2 | 8/2003 | Atobe et al. |
| 6,866,720 B2 | 3/2005 | Kim et al. |
| 2003/0199144 A1 | 10/2003 | Atobe et al. |
| 2005/0064622 A1 | 3/2005 | Atobe et al. |

FOREIGN PATENT DOCUMENTS

| CN | 2473219 Y | 1/2002 |
| CN | 1367636 A | 9/2002 |
| JP | A 04-284247 | 10/1992 |
| JP | A-05-343301 | 12/1993 |
| JP | A 6-260398 | 9/1994 |
| JP | A-11-283897 | 10/1999 |
| JP | A 2000-12613 | 1/2000 |
| JP | A 2001-237073 | 8/2001 |
| JP | A 2002-221912 | 8/2002 |
| JP | A 2004-238685 | 8/2004 |

OTHER PUBLICATIONS

Chinese Office Action w/English-translation, issued Oct. 16, 2009 in Chinese Patent Application No. 200610090878.4.

*Primary Examiner*—Binh X Tran
(74) *Attorney, Agent, or Firm*—Oliff & Berridge, PLC

(57) ABSTRACT

This mask includes: a substrate in which an aperture is formed; a mask member which, along with being formed with a plurality of through holes, is joined to the substrate in correspondence to the aperture; and spacers which hold the substrate and the mask member with a predetermined gap between them.

6 Claims, 9 Drawing Sheets

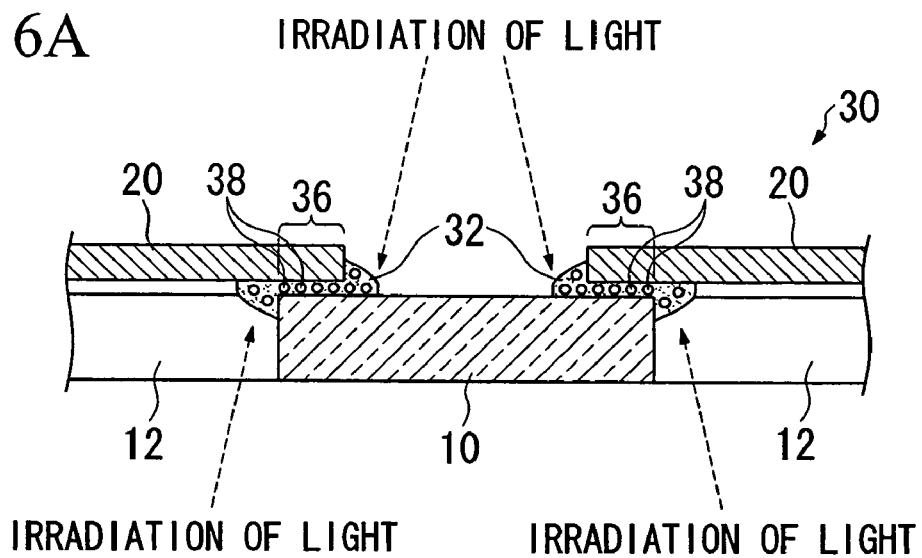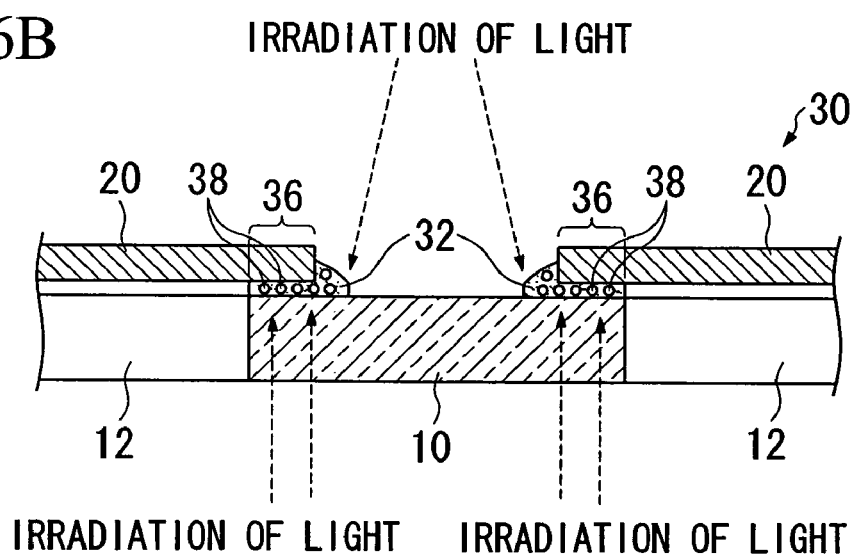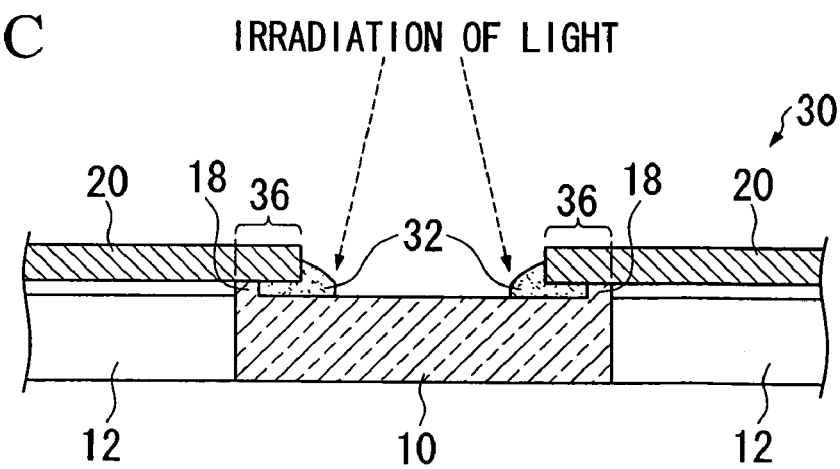

MASK, METHOD OF MANUFACTURING MASK, DEVICE FOR MANUFACTURING MASK, METHOD OF MANUFACTURING LAYER OF LUMINESCENT MATERIAL, ELECTRO-OPTICAL DEVICE, AND ELECTRONIC DEVICE

BACKGROUND OF THE INVENTION

1. Field of the Invention

The present invention relates to a mask which is used in a vapor deposition method or the like, a method of manufacture thereof, a device for manufacture therefore, and the like.

Priority is claimed on Japanese Patent Application Nos. 2003-061355, 2003-061356, and 2003-061357, filed 7 Mar. 2003, and to Japanese Patent Application 2004-036621, filed 13 Feb. 2004, the contents of which are incorporated herein by reference.

2. Background Art

As a self luminescent type display which is used for making a display device which is yet thinner than a liquid crystal display, attention is being attracted, as the next era of technology, to organic EL displays which employ organic EL (electroluminescent) elements (luminescent elements which are manufactured by providing a luminescent layer which is made from an organic material between a positive electrode and a negative electrode). As the luminescent layer material for an organic EL element, there are low molecular weight organic materials and high molecular weight organic materials, and it is known to manufacture a luminescent layer which is made from such a type of low molecular weight organic material by a vapor deposition process. When thus manufacturing a luminescent layer by a vapor deposition process, the direct formation of a thin layer pattern upon the surface upon which the layer is to be made in correspondence to the picture elements is performed by using a mask plate (which is a mask plate which is provided with through holes corresponding to the thin layer pattern which is to be created, and which generally is made from a metal such as stainless steel or the like). In order to respond to demands for very miniature picture elements, it has become practiced to utilize a mask plate which is made very thin, and with a pattern in which very miniature through holes are opened at narrow intervals, and, in order to prevent deformation such as warping or bending or the like accompanying reduction of the strength of such a mask plate, there is a technique, such as for example the one disclosed in Japanese Unexamined Patent Application, First Publication No. 2001-237073, of reinforcing the mask plate by joining it to a substrate.

Due to demands for a display with very fine picture elements, there is a requirement to manufacture a luminescent layer with no so called bleeding. For this, it is necessary to approach together the mask plate and the surface upon which the layer is to be formed as closely as possible, so that the luminescent material does not insinuate itself upon the rear side of the mask plate (the surface which opposes the surface upon which the layer is to be formed), and so as to make the shape of the luminescent layer be roughly the same as the shape of the through holes which are formed in the mask. However, it is difficult to make the thickness of an adhesive for joining together the substrate and the mask plate by curing from the liquid state (the thickness of the junction region) constant. Accordingly, it is not possible to reduce the distance between the mask plate and the surface upon which the layer is to be formed, and there arises the problem that the luminescent material may insinuate itself onto the rear side of the mask plate, thus forming a luminescent layer which has bleeding.

Furthermore, in the manufacture of the above described mask, normally, a method is employed in which the substrate is mounted upon a stage device or the like, and the mask plate is adjusted from its upper side and is joined to it with a photo-curing adhesive, but, if the mask plate is formed from an optically opaque material, it is not possible to cure the photo-curing adhesive by illuminating it with light from the mask side. Due to this, the necessity arises of illuminating it with light from the substrate side. However, in order to illuminate the light from the underside of the stage device, the problem arises that the stage device becomes more complicated and larger in size; and furthermore, when illuminating light from the substrate side while relatively shifting the substrate and the mask plate, there may be the difficulty of deviation of the relative position of the substrate and the mask plate, since the photo-curing adhesive is not cured.

Furthermore, even if a mask is used in which the junction of the mask plate with the substrate is reinforced, when performing vapor deposition processing for the luminescent material, the temperature of the mask is elevated, and the problem may occur that the position of the through holes may deviate due to thermal expansion of the mask, so that unacceptable deviation of the thin film pattern may take place.

The present invention has been made in the light of this type of situation, and takes as its objectives to provide a mask, a method of manufacturing a mask, a device for manufacturing a mask, a method of manufacturing a layer of luminescent material, an electro-optical device, and an electronic device, which can vapor-deposit a luminescent layer with high precision, by easily making the distance between a substrate and a mask plate constant, furthermore by joining together the mask plate, which constitutes a light interception member, and the substrate at high precision without using a special device, and moreover by reducing positional deviation between the pattern on the mask when performing vapor deposition.

SUMMARY OF THE INVENTION

A first aspect of the present invention is a mask, and includes: a substrate in which an aperture is formed; a mask member which, along with being formed with a plurality of through holes, is joined to the substrate in correspondence to the aperture; and spacers which hold the substrate and the mask member with a predetermined gap between them.

According to this aspect, since the mask member is joined to the substrate with a predetermined gap between them, when making a layer of luminescent material upon a substance upon which the layer is to be formed using the mask, it is possible to arrange the mask close to the object upon which the formation is to take place. Furthermore, if spacers are disposed along with an adhesive in the junction region between the substrate and the mask member, it is possible easily to dispose the spacers evenly over the entire junction region. Accordingly, it is possible to join the mask member to the substrate reliably with the predetermined interval between them.

Furthermore, if the spacers consist of a plurality of spherical bodies which have a diameter which is substantially the same as the predetermined gap, then, since it is easy to mix in the spacers uniformly with the adhesive, and further since the spacers do not overlap one another, it is possible easily and moreover reliably to join the mask member to the substrate with the predetermined interval between them.

A second aspect of the present invention is a method of manufacturing a mask, including: a process of preparing a substrate which is formed with an aperture, and a mask member in which a plurality of through holes are formed in an opaque element; a process of applying a photo-curing adhesive to the substrate or to the mask member; a process of joining the mask member to the substrate in correspondence to the aperture; a process of squeezing out the photo-curing adhesive which is adhered to the substrate and the mask member from the junction region between the substrate and the mask member; a process of curing a portion of the photo-curing adhesive by illuminating it with light from the side of the mask member; and a process of curing the photo-curing adhesive by illuminating it with light from the side of the substrate, at least via the aperture.

According to this aspect, since, in a state with the substrate and the mask member being mutually positionally aligned and adhered together, a portion of the photo-curing adhesive is cured so that provisional fixing is performed, therefore, even if during the joining procedure the substrate and the mask member are transported, no positional deviation of the substrate and the mask member takes place, and it is possible to join together the substrate and the mask member by curing the photo-curing adhesive with them in their state of positional alignment just as it is. Accordingly, it is possible to manufacture a mask of high accuracy with no positional deviation between the substrate and the mask member.

Furthermore, if the substrate is made from an optically transparent material, by irradiating with light from the side of the substrate, since not only the photo-curing adhesive which has leaked out from the junction region between the substrate and the mask member, but also the photo-curing adhesive which has been applied to the junction region is cured as well, therefore it is possible to ensure that the junction together of the substrate and the mask member is a reliable one.

Furthermore, if the photo-curing adhesive is caused to leak out from the junction region between the substrate and the mask member, only at the outer peripheral side of the mask member, then it is possible to suppress occurrence of imperfections in the mask, since it is possible to prevent the photo-curing adhesive which has been squeezed out from blocking the pattern which has been formed upon the mask member, which consists of a plurality of through holes.

Furthermore if there is include a process of, after having adhered together the substrate and the mask member, applying the photo-curing adhesive to the outer peripheral side of the mask member, then, since it is possible reliably to attain the state in which the photo-curing adhesive has been squeezed out from the junction region between the substrate and the mask member only to the outer peripheral side of the mask member, therefore it is possible provisionally to fix the substrate and the mask member in a state of mutual positional alignment in a reliable manner.

A third aspect of the present invention is a method of manufacturing a mask, including: a process of preparing a substrate which is formed with an aperture, and a mask member in which a plurality of through holes are formed; a process of joining the mask member to the substrate in correspondence to the aperture; and a process of managing the temperature of the junction between the mask member and the substrate.

According to this aspect, it is possible to manufacture the mask at the same temperature at the mask will be used, so that it is possible to suppress warping or bending accompanying variation of temperature during use of the mask. Accordingly, it is possible to manufacture a display or the like which has very fine picture elements. Moreover, it is also possible to obtain a junction of the desired quality by performing the temperature management according to the characteristics of the adhesive or the like which is being used.

Furthermore, if the mask is a mask in which, along with a plurality of the apertures being formed in the substrate, a plurality of the mask members are joined in respective correspondence to the apertures, and the temperature of the junction for each of the plurality of mask members is managed, then, if for example during use of the mask a temperature distribution occurs upon the mask, it is possible to suppress warping and bending during use of the mask over the entire extent of the mask, by performing the joining while varying the temperature for each position at which the plurality of mask members are joined.

Furthermore, if the mask member and the substrate are joined together by being brought to a predetermined temperature, then, since the mask member and the substrate are maintained at the predetermined temperature, and since they are joined together in the state in which the mask has completed its thermal expansion or shrinkage, therefore the influence due to thermal deformation of the mask is small even when it is used at the predetermined temperature, and it is possible to suppress deviation of the pattern.

Furthermore, if the predetermined temperature is the temperature of the mask during vapor deposition processing using the mask, then, since the mask is manufactured at the temperature at which the mask will be used during the vapor deposition process, the influence due to thermal deformation of the mask is small even when performing the vapor deposition process using the mask, and it is possible to suppress deviation of the pattern.

A fourth aspect of the present invention is a method of manufacturing a mask, including: a process of preparing a substrate which is formed with an aperture, and a mask member in which a plurality of through holes are formed in an opaque element; a process of mixing spacers into a photo-curing adhesive which joins together the substrate and the mask member; a process of applying the photo-curing adhesive to the substrate or to the mask member; a process of joining the mask member to the substrate in correspondence to the aperture; a process of squeezing out the photo-curing adhesive which is adhered to the substrate and the mask member from the junction region between the substrate and the mask member; a preliminary curing process of curing a portion of the photo-curing adhesive by illuminating it with light from the side of the mask member; and a main curing process of curing the photo-curing adhesive by illuminating it with light from the side of the substrate, at least via the aperture.

According to this aspect, since a portion of the photo-curing adhesive is cured in the state in which the substrate and the mask member are positionally aligned and adhered together, so as to create a provisional fixing, therefore no positional deviation takes place between the substrate and the mask member, even if during the process of joining them together the substrate and the mask member are transported, and it is possible to join together the substrate and the mask member by curing the photo-curing adhesive with this state of positional alignment just as it is. Furthermore, by mixing spacers of a predetermined particle diameter evenly into the photo-curing adhesive, it is possible to make the interval between the mask member and the substrate even in an easy and reliable manner.

Furthermore if, in at least the preliminary curing process and the main curing process, the temperature of the junction between the mask member and the substrate is managed, then, since the manufacture is performed by joining together the mask member and the substrate at the same temperature as the temperature at which the mask will be used, therefore during use of the mask it is possible to suppress warping and bending accompanying variation of temperature. Furthermore, it also becomes possible to obtain a junction of the desired quality by performing temperature management according to the characteristics of the adhesive which is used and the like. Accordingly, it is possible to manufacture a mask of high accuracy, which has no positional deviation between the substrate and the mask member, and it is possible to obtain a display or the like which has fine picture elements.

A fifth aspect of the present invention is a device for manufacturing a mask including a substrate which is formed with an aperture, and a mask member which, along with being formed with a plurality of through holes, is joined in correspondence to the aperture; including: a mask support section which holds the mask member; a mask temperature management section which manages the temperature of the mask member, a substrate support section which holds the substrate; and a substrate temperature management section which manages the temperature of the substrate; wherein the mask support section and the substrate support section are shifted relative to one another, and the mask member is adhered to the substrate.

According to this aspect, since the substrate and the mask member which make up the mask are joined together by bringing them to the same temperature as the temperature at which the mask will be used, therefore the heat deformation upon temperature change during use of the mask is small, and it is possible to suppress deviation of the pattern.

Furthermore, if it is arranged to include a lamp which cures a photo-curing adhesive which is applied to the junction region of the substrate and the mask member, since the mask is manufactured at the same temperature as the temperature at which the mask will be used, therefore it is possible to suppress warping or bending of the mask in accompaniment with variation of temperature.

A sixth aspect of the present invention is a method of manufacturing a layer of luminescent material, wherein, as a mask which is used when forming a layer of luminescent material by vapor deposition, there is used: a mask as described above; or a mask which has been obtained by a method of manufacture as described above; or a mask which has been obtained by the device for manufacturing as described above.

According to this aspect, since, along with the mask being one which has no positional deviation, the positional deviation of the pattern which accompanies thermal expansion or shrinkage is small, therefore it is possible to form a luminescent layer which has no deviation, even when making the layer of luminescent material by vacuum vapor deposition.

A seventh aspect of the present invention is an electro-optical device, and includes, as a luminescent layer, a layer of luminescent material which has been made by the above described method.

According to this aspect, since the positional deviation of the luminescent layer is low, therefore it is possible to manufacture an electro-optical device with a display which has very fine picture elements, and so on.

An eighth aspect of the present invention is an electronic device, and includes the above described electro optical device as a display means.

According to this aspect, since as a display means there is provided a display with very fine picture elements, therefore it is possible to manufacture an electrical device of which the display of the display means is easy to view and is clear.

BRIEF DESCRIPTION OF THE DRAWINGS

FIGS. 6A to 6C are figures showing a method of applying a photo-curing adhesive.

DESCRIPTION OF THE PREFERRED EMBODIMENTS

In the following, embodiments of the method of manufacturing a mask, the device for manufacturing a mask, the method of manufacturing a layer of luminescent material, the electro-optical device, and the electronic device of the present invention will be explained with reference to the drawings.

Figure 1A:
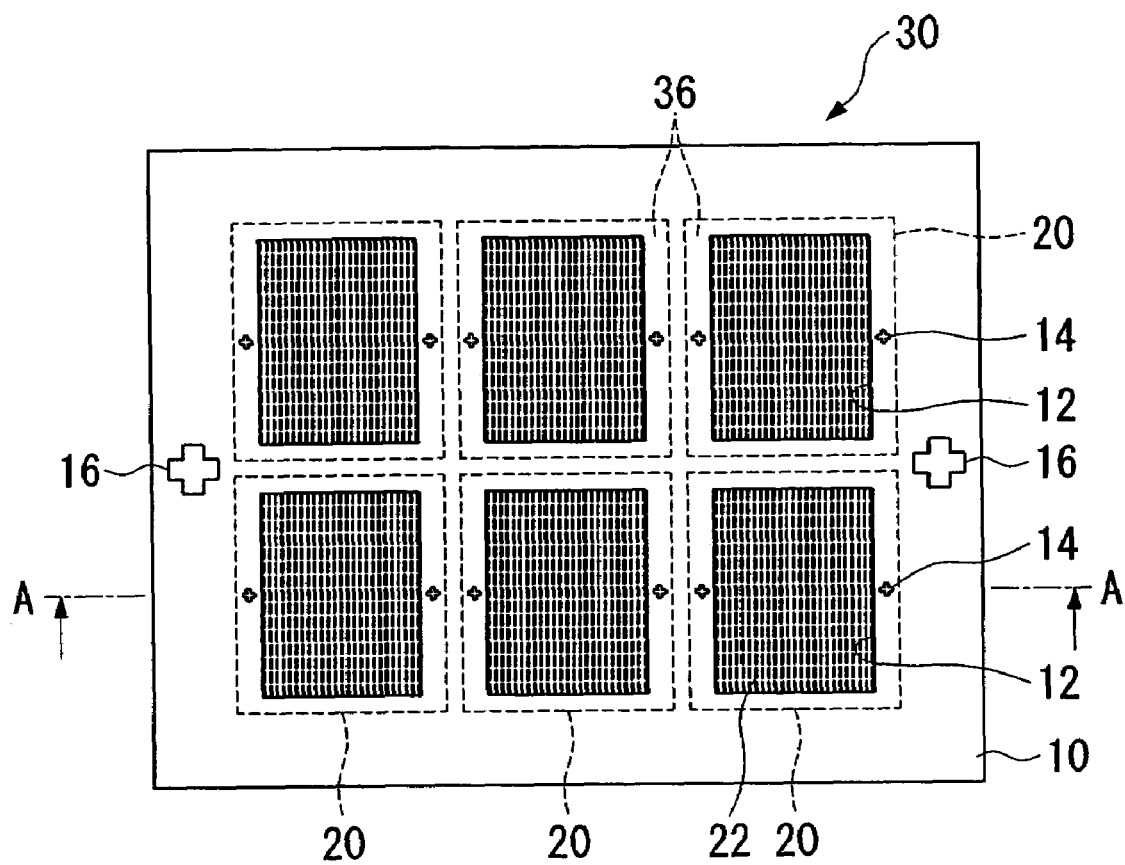
FIGS. 1A and 1B are figures showing a mask.
Figure 1B:
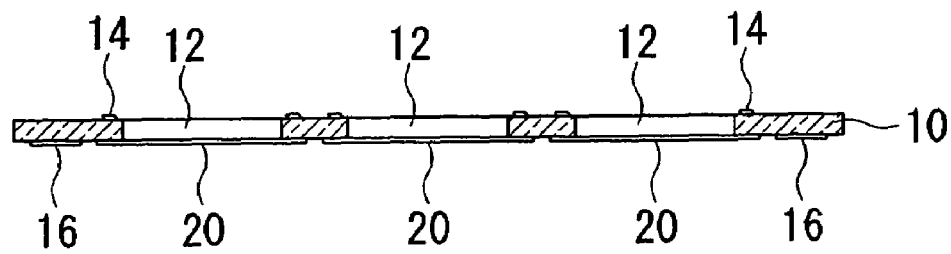

FIGS. 1A and 1B are figures showing a mask 30. FIG. 1B is a sectional view along the line A-A in FIG. 1A.

Figure 2A:
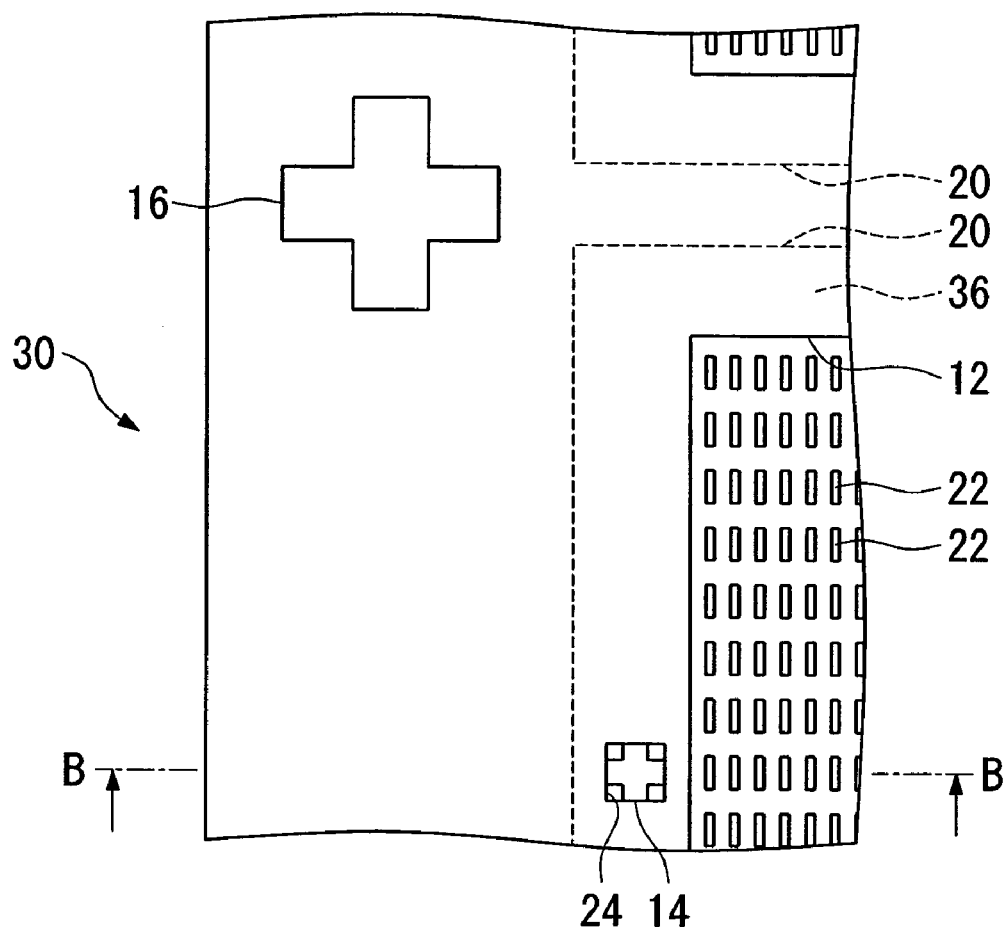
FIGS. 2A and 2B are enlarged figures showing a junction region of the mask.
Figure 2B:
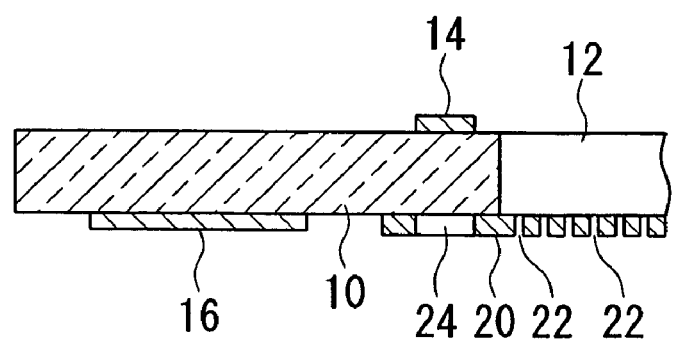

FIGS. 2A and 2B are enlarged figures showing a junction region 36 of the mask 30. FIG. 2B is a sectional view along the line B-B in FIG. 2A.

The mask 30 which is used in an embodiment of the present invention is made from a substrate 10 and 6 mask members 20. Apertures 12 are formed at 6 locations in the substrate 10, and, corresponding to one aperture 12, one mask member 20 is disposed so as to cover the aperture 12. In other words, the regions at which the edge portion of a mask member 20 and the edge portion of an aperture 12 of the substrate 10 overlap one another are joined together as a junction region 36. In more detail, the entire peripheral edge portion (the angular ring shaped portion) of the mask member 20 and the entire peripheral edge portion (the angular ring shaped portion) of the aperture 12 of the substrate 10 are mutually overlapped and joined together.

A pattern which is made up by a plurality of through holes 22 is formed upon the mask member 20, and this pattern is joined to the substrate 10 so as to be arranged at the interior of the aperture 12. It should be understood that the apertures 12 and the mask members 20 are not limited to being 6 (groups) in number; they could be multiple groups, or could be a single group; but, in order to enhance the manufacturability of the organic EL display, in many cases, a plurality of apertures 12 and mask members 20 are provided, as in this embodiment. Furthermore, along with the desire for increase in the size of EL displays, the substrate 10, the apertures 12, and the mask members 20 also are getting larger.

Furthermore, the positions of the substrate 10 and the mask members 20 are determined by the use of first alignment marks 14 which are formed upon the substrate 10 and second alignment marks 24 which are formed upon the mask members 20. It should be understood that the mask members 20 are fixed upon the surface of the substrate 10 on the opposite side to the surface on which the first alignment marks 14 are formed. Furthermore, a mask position determination mark 16 is formed upon the substrate 10, and this is used for setting the position of the mask 30 during the vapor deposition process.

Although a photo-curing adhesive 32 which has an ultraviolet light curing characteristic, or the like, is utilized at the junctions between the substrate 10 and the mask members 20, this is not limitative; it would also be acceptable to utilize an anode junction or a mechanical junction means. Furthermore, a plurality of spacers 38 of a uniform diameter are mixed into the photo-curing adhesive 32, and thereby the substrate 10 and the mask members 20 are joined together with a roughly constant gap therebetween (refer to FIGS. 6A to 6C). It should be understood that the details of the photo-curing adhesive 32 and the spacer 38 will be described hereinafter.

Figure 3:
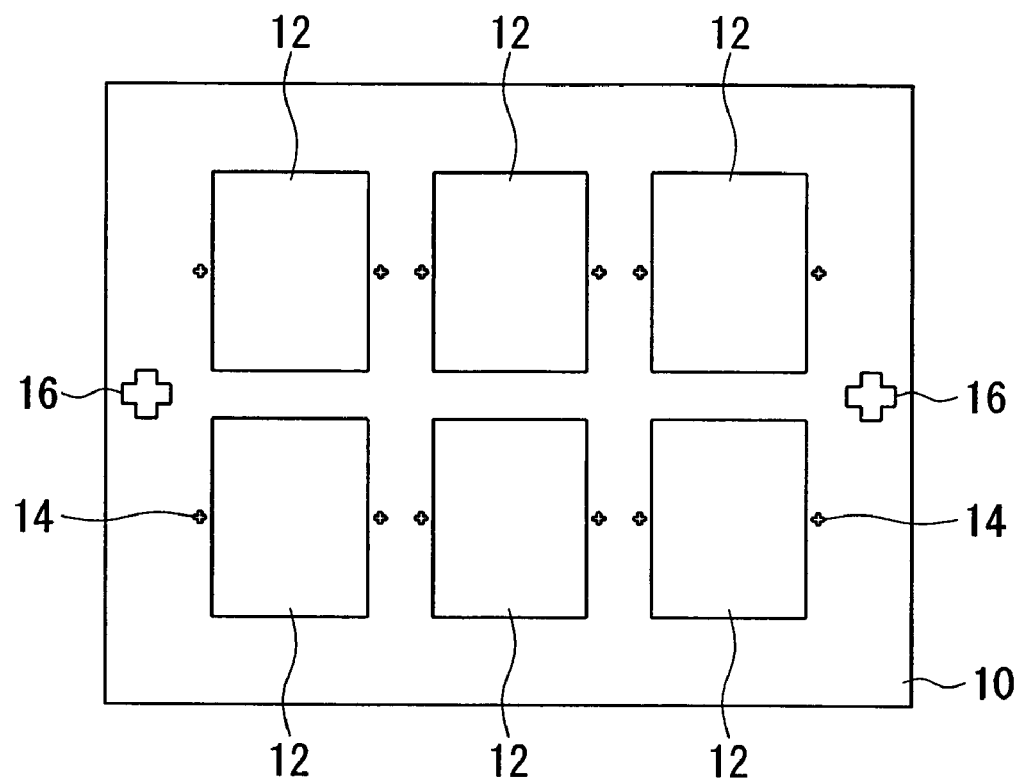
FIG. 3 is a figure showing a substrate.

FIG. 3 is a figure showing the substrate 10.

The substrate 10, which is termed the frame, is a light-transparent substrate, and it is made from a borosilicate glass (for example Corning #7740 (Pyrex glass) (registered trademark)). Due to this, it is possible to utilize the photo-curing adhesive 32 which has an ultraviolet light curing characteristic or the like as the junction means between the substrate 10 and the mask members 20, and to illuminate it with ultraviolet light or the like from the side of the substrate 10. Six rectangular apertures 12 are formed in the substrate 10. The apertures 12 are smaller than the mask members 20, so that the mask members 20 can be joined to the edge portions of the apertures 12, and furthermore they are formed to be bigger than the pattern regions which are formed upon the mask members 20 (the pattern regions which are constituted by the plurality of through holes 22), so that the patterns are not covered by the substrate 10.

The photo-curing adhesive 32 is applied upon the region where the substrate 10 and the mask members 20 overlap, to create the junction regions 36. It should be understood that the form of the apertures 12 is not limited to being rectangular; it is possible to make them of various different forms, to correspond with the shape of the organic EL display which is being produced.

Furthermore, first alignment marks 14 are formed upon the substrate 10. The first alignment marks 14 are provided at the rear surface side of the junction surface with the mask members 20, and are used for position setting with respect to the mask members 20. The first alignment marks 14 are made as a metallic layer by spattering or vapor deposition or the like, or by etching or a mechanical process or the like. Furthermore, mask position determination marks 16 are formed upon the substrate 10.

The mask position determination marks 16 are provided at the vicinities of the end portions on the side of the surface to which the mask members 20 are joined, and are used for positioning a mask 30 when performing vapor deposition. The mask position determination marks 16, just like the first alignment marks 14, are made as a metallic layer, or by etching or a mechanical process or the like. It should be understood that the mask position determination marks 16 are not limited to the case of being provided upon the substrate 10; they could also be provided upon the mask members 20.

Figure 4:
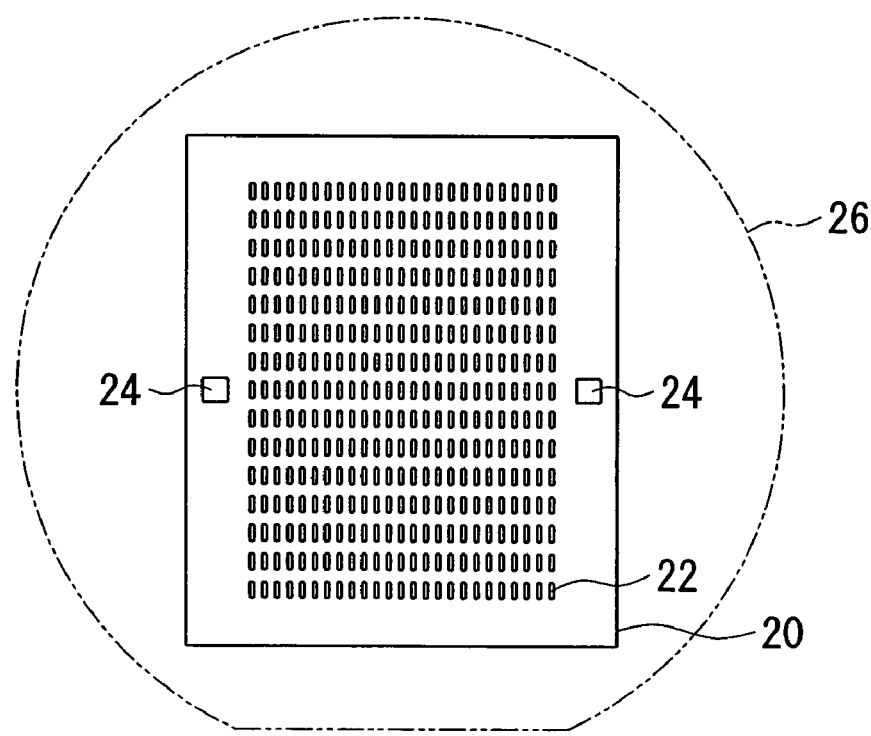
FIG. 4 is a figure showing a mask member.

FIG. 4 is a figure showing a mask member 20.

The mask member 20, which is a so called screen plate, is made in a rectangular form from, for example, a metallic substance such as silicon or the like. The mask member 20 may be made from a silicon wafer 26, and in that case the silicon wafer 26 is cut to correspond to the mask member 20. A plurality of through holes 22 are formed in the mask member 20. The shape of the through holes 22 may be any of square, parallelogram, or circular, and the pattern (the screen) is made according to the shape, the arrangement, and the number of the through holes 22.

The through holes 22 are made by etching (for example anisotropic etching which depends upon the orientation of the crystal surface) or the like. The wall surfaces of the through holes 22 may be perpendicular with respect to the surface of the mask member 20, or may be provided with a taper. It should be understood that the pattern is not limited to being formed in advance before the mask member 20 is joined to the substrate 10; it could be formed after such joining. It should also be understood that an optically opaque material may be used for the mask member 20; for example, the mask member 20 may be made from super strength fibers.

Furthermore, second alignment marks 24 are formed upon the mask member 20. The second alignment marks 24 are ones made in correspondence to the first alignment marks 14 which are formed upon the substrate 10, and, by aligning the first alignment marks 14 and the second alignment marks 24, the substrate 10 and the mask member 20 can be joined at a predetermined positional relationship.

It should be understood that the second alignment marks 24, just like the first alignment marks 14 and the like, are formed as a metallic layer, by etching, or by a mechanical process or the like. Furthermore, the mask position determination marks 16 are not limited to being provided upon the substrate 10; they may also be formed upon the mask member 20.

Figure 5:
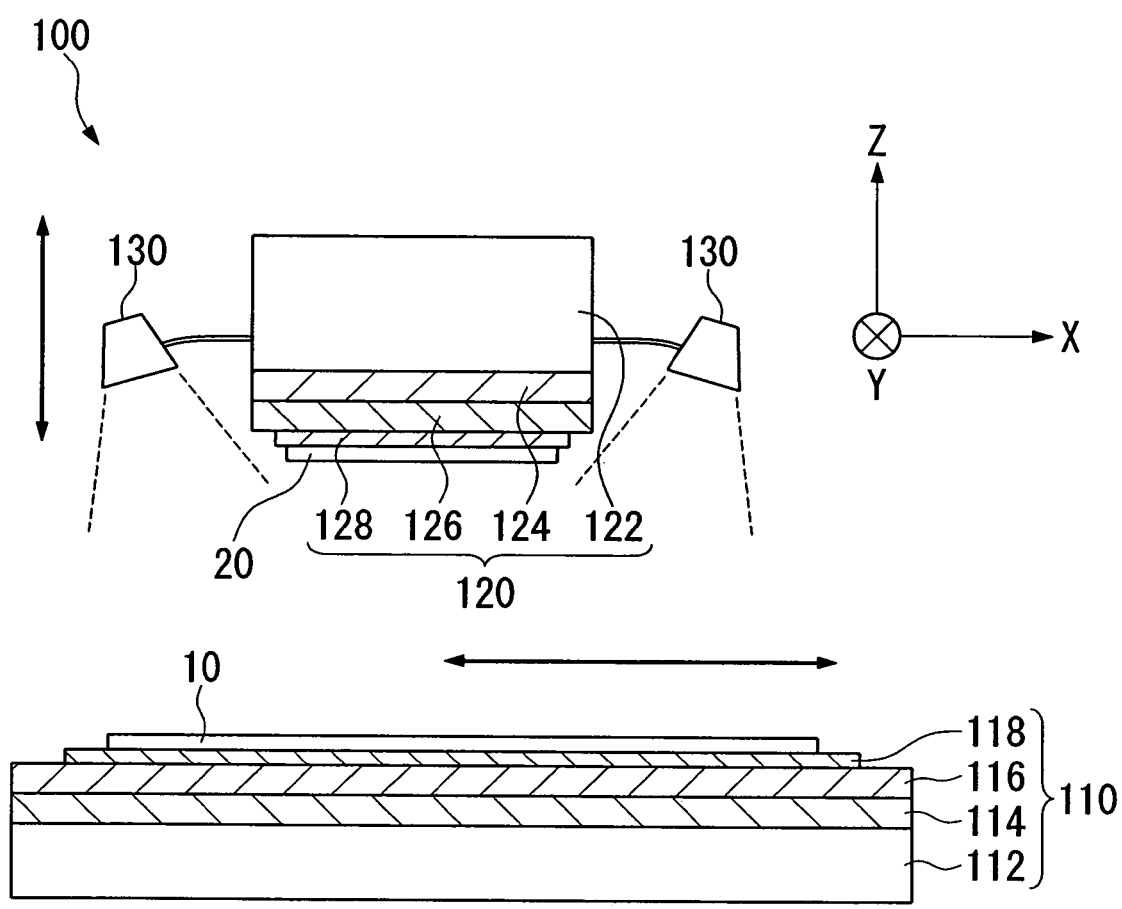
FIG. 5 is a schematic figure showing a device for manufacturing a mask.

FIG. 5 is a schematic view showing a device 100 for manufacturing a mask, with which the mask 30 is manufactured.

The device 100 for manufacturing a mask is made up from a stage (a substrate support section) 110 which shifts the substrate 10 in the X direction or the Y direction, a head (a mask support section) 120 which is arranged above the stage 110 and shifts the mask member 20 in the Z direction, and a lamp 130 which is arranged at the side of the head 120 and which cures the photo-curing adhesive 32.

The stage 110 is made up from an XY table 112 which can shift in the X direction and in the Y direction, a heat interception member 114 which intercepts heat transmission to the XY table 112, a thermo module (a substrate temperature management section) 116 which heats up or cools down the substrate 10, and a holder 118 which holds the substrate 10; and the heat interception member 114, the thermo module 116, and the holder 118 are disposed above the XY table 112 in that order.

The head 120 is made up from a Z table 122 which can shift in the Z direction, a heat interception member 124 which intercepts heat transmission to the Z table 122, a thermo module (a mask temperature management section) 126 which heats up or cools down the mask member 20, and a holder 128 which holds the mask member 20; and the heat interception member 124, the thermo module 126, and the holder 128 are disposed above the Z table 122 in that order.

The position information of the stage 110 and the head 120, and the temperature information of the thermo modules 116 and 126, are sent to a control section not shown in the drawings which controls the device 100 for manufacturing a mask, and the control section controls the device 100 for manufacturing a mask based upon this information.

It should be understood that the head 120 is not limited to the case of holding a single mask member 20; it would be acceptable for it to hold a plurality of the mask members 20 at the same time. Furthermore, the thermo modules 116 and 126 are not limited to being provided to the stage 110 and the head 120 respectively; it would be acceptable to provide a thermo module which heats up or cools down the substrate 10 and the mask member 20 at the same time.

Next, a method for manufacturing a mask 30 using this device 100 for manufacturing a mask will be described with reference to the appended drawings.

FIGS. 6A to 6C are figures showing a method of applying the photo-curing adhesive 32; FIG. 6A is a figure showing the application method of the present embodiment, FIG. 6B is a method showing a variant embodiment of the application method, and moreover FIG. 6C is a figure showing a variant embodiment for spacers.

A photo-curing adhesive 32 is utilized at the junction between the substrate 10 and the mask member 20. Although an adhesive which is endowed with the characteristic of being cured by ultraviolet light is a representative photo-curing adhesive, apart from that, there are types which are cured by an electron beam, or which are cured by infra-red radiation or visible light. Basically, it is made from radical-polymerizable acryl oligomers and monomers, and is a polymerization initiator which reacts with a predetermined type of light.

It is cured in a few seconds by being irradiated with ultraviolet light or the like, so that, according to requirements, it is possible to obtain a cured material which has various characteristics such as flexibility, stickiness, chemical resistance, electrical characteristics and so on.

In the process of mask manufacture, first, a plurality of spherical spacers 38 are mixed with the photo-curing adhesive (in a spacer mixing process). The spacers 38 are small spheres of from a few to a few tens of microns in diameter, and they are made from metal, ceramic, glass, plastic, or the like. Furthermore, it is desirable for the spacers 38 to be bodies which are sufficiently rigid not to deform when they are pressed, and to be made using a material which is endowed with the property of heat resistance. Moreover, it is desirable for them to be accurate spheres with a constant diameter. It should be understood that the spacers 38 are not limited to being spherical bodies; they could also be plates, circular cylinders, prisms, cubes, ellipsoids, or the like.

Next, the substrate 10 is held by the stage 110, and furthermore the mask member 20 is held by the head 120. The photo-curing adhesive 32 is applied to the junction region 36 between the substrate 10 or the mask member 20 (in an adhesive application process). When the photo-curing adhesive 32 is adhered to the substrate 10 and the mask member 20, a sufficient amount is applied to be squeezed out from the junction region 36. This amount is obtained in advance by experiment or the like.

Next, the thermo modules 116 and 126 are heated up, and the temperatures of the substrate 10 and the mask member 20 are raised to about 50° C.

In the state in which the substrate 10 and the mask member 20 are thermally expanded and moreover the adhesive is applied, the stage 110 is shifted, and the first alignment mark 14 of the substrate 10 is positionally aligned with the second alignment mark of the mask member 20, and furthermore the head 120 is shifted towards the stage 110, and the mask member 20 is pressed towards the substrate 10 and is adhered thereto. By doing this (in an adhesion process), as shown in FIG. 6A, it is possible to attain a state in which the photo-curing adhesive 32 is squeezed out from both sides of the junction region 36 (i.e., from both the outer peripheral side of the mask member 20 and also the inner peripheral side of the aperture 12).

In this state, the photo-curing adhesive 32 which has been squeezed out to the outer peripheral side of the mask member 20 (in other words, a portion of the photo-curing adhesive 32) is cured by illuminating light against the mask member 20 from the lamp 130 (in a preliminary curing process).

Next, the mask 30 (the substrate 10 and the mask member 20) is released from the holders 118 and 128, and is transported to the exterior of the device 100 for manufacturing a mask. At this time no positional deviation between the substrate 10 and the mask member 20 occurs, since the photo-curing adhesive 32 which has already been squeezed out to the outer peripheral side of the mask member 20 has been cured. In other words, the substrate 10 and the mask member 20 are put into a provisionally fixed state.

Furthermore, the photo-curing adhesive 32 which has been squeezed out to the inner peripheral side of the aperture 12 is illuminated with light from the side of the substrate 10, which is the opposite side from the previous one, so that it is cured (in a main curing process).

It should be understood that, if the substrate 10 is made from an optically transparent material, it is possible also to cur the photo-curing adhesive 32 in the junction region 36, along with curing the photo-curing adhesive 32 which has been squeezed out to the inner peripheral side of the aperture 12.

It is desirable, in this basic curing process as well, to elevate the temperature of the substrate 10 and the mask member 20, so as to cause thermal expansion thereof.

By repeating the above operations, the six mask members 20 are joined to the substrate 10, and the mask 30 is manufactured. It should be understood that, along with arranging for the six mask members 20 not to be mutually overlapped, the six mask members are arranged on a single surface side of the substrate 10.

By mixing the spacers 38 into the photo-curing adhesive 32 in this manner, it is possible to keep the height of the mask member 20. In other words, by mixing the spacers 38 which consist of a plurality of spheres into the photo-curing adhesive 32, the spacers 38 are spread out over the entire junction region 36 in an even manner. Furthermore, by applying pressure when adhering together the substrate 10 and the mask member 20, it is possible to arrange the spacers 38 so that they do not overlap one another and they are uniformly distributed over the junction region 36. It should be understood that, even when the mask member 20 is pressed against the substrate 10, since this force is supported by a plurality of the spheres, the force is dispersed, and the shapes will not easily be deformed or destroyed. Accordingly, as shown in FIG. 6A, it is possible to make the height of the mask member 20 to be constant.

It should be understood that, for example, as shown in FIG. 6C, it would also be acceptable to form a convex portion 18 on the entire circumferential end portion of the aperture 12 of the substrate 10, so that, by mounting the mask member 20 over the convex portion 18, the convex portion 18 was made to function as the spacers 38; or to arrange to provide the convex portion 18 to the mask member 20.

Furthermore, since the substrate 10 and the mask member 20 are provisionally fixed together by causing the photo-curing adhesive 32 which has spread out to the outer circumferential side of the mask member 20 to cur by illuminating it with light from the side of the mask member 20, it is possible to transport the mask 30 (the substrate 10 and the mask member 20), and to turn it upside down. Since, in this device 100 for manufacturing a mask, it is not necessary to provide any lamp for illuminating light from the underside of the XY table 112 (the side of the substrate 10), accordingly, it is possible to manufacture the mask 30 by joining together the substrate 10 and the mask member 20 without making the device more complicated, and without increasing its size, and thus the conventional device 100 for manufacturing a mask can be applied.

It should be understood that the work of illuminating light from the side of the substrate 10 may also be done by turning over the mask 30, and by returning it to the device 100 for manufacturing a mask and illuminating it with light; or it may be done by illuminating it with light with a lamp, not shown in the figures, which is provided outside the device 100 for manufacturing a mask. Furthermore, the work of illuminating the light from the side of the substrate 10 is nom limited to the case of performing it for each mask member 20; it would also be acceptable, after having joined a plurality of the mask members 20 to the substrate 10 (provisional fixing), to illuminate light upon them all together from the side of the substrate 10.

Furthermore, during the above described manufacturing process for the mask 30, when illuminating light upon at least the photo-curing adhesive 32 and curing it, it would also be acceptable to raise the temperature of the substrate 10 and the mask member 20 to about 50° C. Moreover, it would also be acceptable to heat up the substrate 10 and the mask member 20 during the entire manufacturing process for the mask 30, since time is required for raising the temperature.

Furthermore if, along with increase in the lightness and the thinness of the mask member 20, the distance between the pattern and the aperture 12 becomes close, it is desirable not to allow the photo-curing adhesive 32 to be squeezed out to the inside of the aperture 12. In other words, this is in order not to allow the through holes 22 which define the pattern to become plugged up by the photo-curing adhesive 32, which would be undesirable.

Thus, if the substrate 10 is made from a transparent material, as shown in FIG. 6B, the photo-curing adhesive 32 is applied so as not to be squeezed out to the interior peripheral side of the aperture 12. For example, the region of application is determined and set in advance by applying a little towards the outside of the interior of the junction region 36, or the like, and by experiment or the like.

Furthermore if, due to the fact that the photo-curing adhesive 32 is of low viscosity, it is not possible to determine the amount or the range of its squeezing out to be constant, then the photo-curing adhesive 32 is applied in an amount so as not to be squeezed out from the junction region 36, and, after fixing together the substrate 10 and the mask member 20, photo-curing adhesive 32 is again applied to the outer peripheral side of the mask member 20. By doing this, it is possible reliably to attain the state in which the photo-curing adhesive 32 has been squeezed out from the mask member 20 (refer to FIG. 6B). After the photo-curing adhesive 32 has been cured (provisional fixing) by being irradiated with light from the side of the mask member 20, by irradiating light from the side of the substrate 10, the light passes through the substrate 10, and cures the remainder of the photo-curing adhesive 32.

It should be understood that the method of applying the photo-curing adhesive 32 again after having adhered the substrate 10 and the mask member 20 together in such a manner that none of the photo-curing adhesive 32 has been squeezed out from the junction region 36 is not limited only to the case of squeezing out the photo-curing adhesive 32 to the outer peripheral side of the mask member 20; it is a method which is also effective in the case of squeezing out to both sides (the outer peripheral side of the mask member 20 and the inner peripheral side of the aperture 12).

Here, making the junction while raising the temperature of the substrate 10 and the mask member 20 is in order to manufacture the mask 30 under the same conditions as the conditions in which it will be used. In other words it is because, in practice, when forming a film by vacuum vapor deposition of luminescent material using the mask 30, the temperature of the mask 30 is raised to about 50° C. In other words, by manufacturing the mask 30 under the same conditions as the conditions in which it will be used in the process of vacuum vapor deposition, it is possible to suppress deviation of the pattern during the vacuum vapor deposition process due to thermal expansion of the mask 30.

To explain this in more detail, the coefficient of thermal expansion of the substrate 10 is about $3.2 \times 10^{-6}/°$ C., and moreover the coefficient of thermal expansion of the silicon from which the mask member 20 is made is about 2.6 to $3.6 \times 10^{-6}/°$ C. Due to this, since the substrate 10 and the mask member 20 have roughly the same coefficient of thermal expansion and expand or shrink by roughly the same amount, occurrence of warping or bending of the mask 30 (the mask member 20) due to difference of the coefficients of thermal expansion is suppressed. On the other hand, the coefficient of thermal expansion of the glass substrate 50 (for example, a tantalate lithium substrate or the like) which constitutes the substrate of an EL display is about $3.8 \times 10^{-6}/°$ C. Accordingly, if the mask 30 and the glass substrate 50 are used at the same temperature, since the mask 30 and the glass substrate 50 have roughly the same coefficient of thermal expansion, they expand or shrink by roughly the same amount, so that it is impossible for deviation of the pattern to occur.

However, when vacuum vapor deposition of a luminescent material is performed upon the glass substrate 50 using the mask 30, a temperature difference is present (refer to FIG. 7) between the mask which is close to a heat source (the vapor deposition source) and the temperature of the glass substrate 50 which is in the shade of the mask 30 with respect to the heat source. Due to this temperature difference, the thermal expansion of the mask 30 and the thermal expansion of the glass substrate 50 are different, so that positional deviation of the pattern occurs, which is undesirable.

More specifically, when the temperature of the mask 30 during vacuum vapor deposition is about 50° C., the temperature of the glass substrate 50 is about 35° C., and the atmospheric temperature is about 20° C., their temperatures are respectively raised by about 30° C. and about 15° C. If the size of the mask 30 and the glass substrate 50 is 400 mm×500 mm, then the variation of the distance (about 320 mm) from their centers to their four corners (angles) will be, for the mask 30, about 34.6 to 25.0 μm, and, for the glass substrate 50, 18.3 μm, so that the difference between the thermal expansion of the mask 30 and the glass substrate 50 (the deviation of the position of the pattern) will be about 16.3 to 6.7 μm.

Accordingly since, by manufacturing the mask 30 by joining together the substrate 10 and the mask member 20 at the same temperature as the temperature (about 50° C.) as the temperature of the mask 30 during the vacuum vapor deposition process, the mask 30 is manufactured in the state in which the above described deviation of the pattern has occurred in advance, therefore it is possible to suppress deviation of the pattern, since, when the mask 30 is actually used, deviation of the position of the pattern due to thermal expansion does not occur. Furthermore, since it is manufactured under the same conditions as when it is used, it is also possible to prevent occurrence of deformation such as warping or bending or the like of the mask 30 accompanying variation of temperature.

It should be understood that it is also possible further to suppress deviation of the pattern, due to making the pattern which is formed upon the mask member 20 (the plurality of through holes 22) at the same temperature as the temperature of the mask 30 during the vacuum vapor deposition process. In this manner, the mask 30 according to this embodiment is very suitable for being used for vacuum vapor deposition.

Next, a method of using the mask 30 which has been manufactured, and the like, will be explained with reference to the figures.

Figure 7:
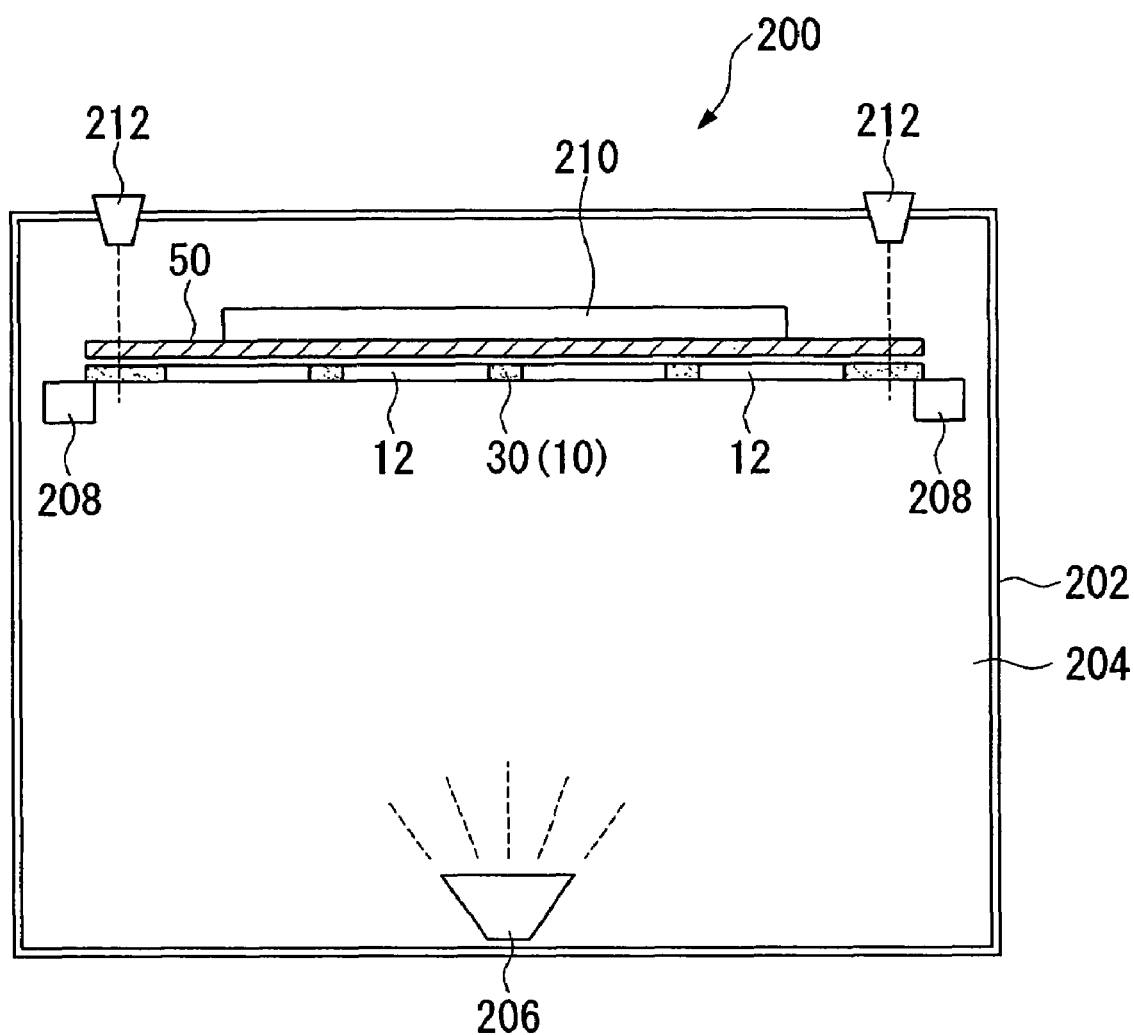
FIG. 7 is a figure showing a vacuum vapor deposition device.

FIG. 7 is a figure showing a vacuum vapor deposition device 200 in which the mask 30 is used.

The vacuum vapor deposition device 200 includes a chamber 202 which defines a space 204 which houses the mask 30 and the glass substrate 50 and which is sealed, a vapor deposition source 206 which evaporates luminescent material at high temperature and emits it towards the mask 30, a holder 208 which holds the mask 30, a holder 210 which holds the glass substrate 50, and a camera 212 for positional alignment of the mask 30 and the glass substrate 50. A luminescent layer is built up upon the glass substrate 50 by, along with bringing the space 204 down almost to a vacuum, also emitting the luminescent material at high temperature from the vapor deposition source 206 towards the glass substrate 50 which has been covered by the mask 30.

Figure 8A:
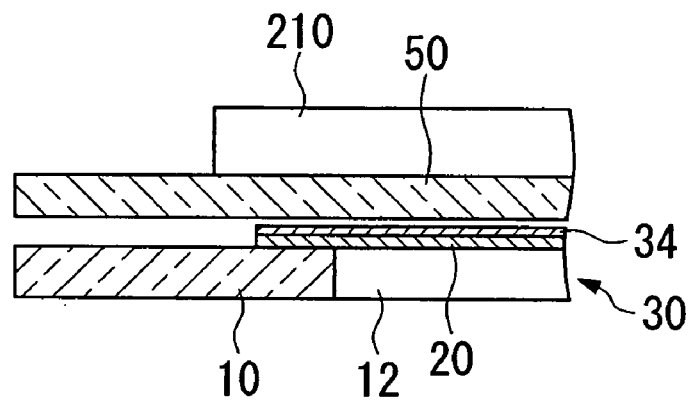
FIGS. 8A and 8B are figures showing a method of using a mask.
Figure 8B:
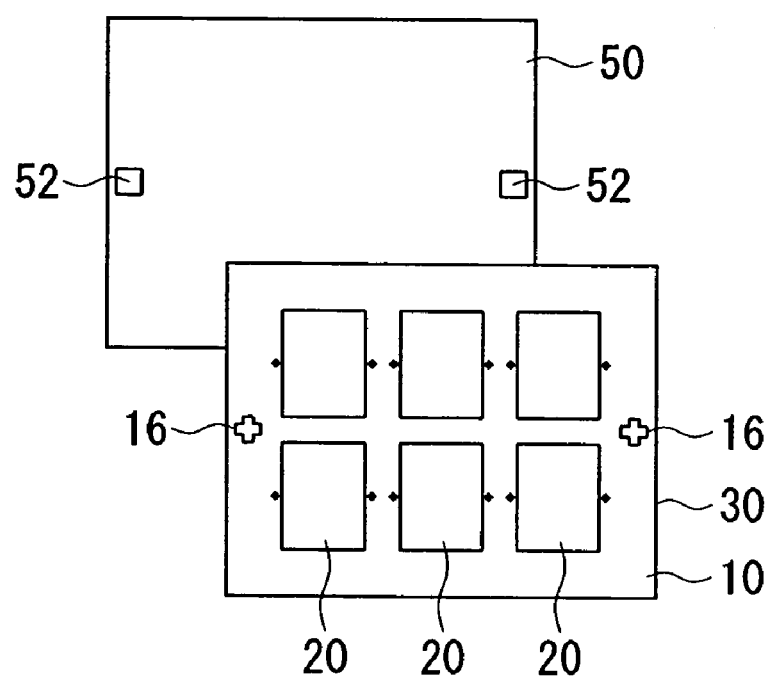

FIGS. 8A and 8B are figures showing the method for using the mask 30; FIG. 8A is an enlarged view of the mask 30 and the glass substrate 50 of FIG. 7.

A layer of magnetic material 34, which consists of a strongly magnetic material such as iron, cobalt, nickel or the like, is formed in advance upon the mask 30 (for example, upon the mask member 20). Alternatively, it would also be acceptable to form the layer of magnetic material 34 as Ni, Co, Fe, or a magnetic metallic material which is an alloy of stainless steel including an Fe component, or the like, or by joining together a magnetic metallic material and a non magnetic metallic material. The glass substrate 50 is a substrate for making a plurality of electro-optical devices (for example, organic EL devices) 500, and it is formed in advance with the electrode 54 (for example a transparent electrode made from ITO or the like), or the hole transportation layer 56 (refer to FIG. 9A). It should be understood that it would also be acceptable to form it with an electron transportation layer. The mask 30 is arranged so that the mask member 20 is positioned upon the side of the glass substrate 50. The holder 210 which is made from a magnet is disposed after the rear of the glass substrate 50, and it is arranged so as to attract the layer of magnetic material 34 which has been formed upon the mask 30 (the mask member 20). By doing this, even if warping occurs upon the mask 30 (the mask member 20), it is possible to remedy this.

FIG. 8B is a figure for explanation of a method of positionally aligning the mask.

The mask position determination mark 16 which was formed in advance upon the substrate 10 and a position determination mark 52 which was formed in advance upon the glass substrate 50 are observed with the camera 212 (refer to FIG. 7), and the substrate 10 and the glass substrate 50 are positionally aligned by making the mask position determination mark 16 and the position determination mark 52 agree with one another. It should be understood that the substrate 10 and the glass substrate 50 are held so as to be separated by a gap of about 50 μm or less.

Figure 9A:
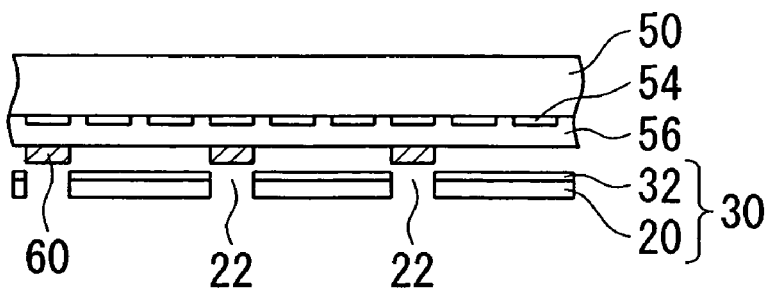
FIGS. 9A to 9C are figures showing a method of manufacturing a layer of a luminescent material.
Figure 9B:
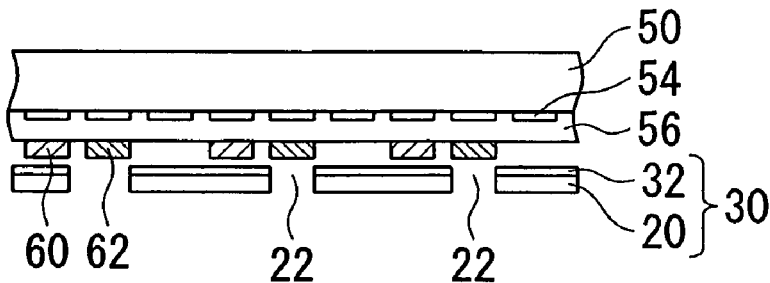
Figure 9C:
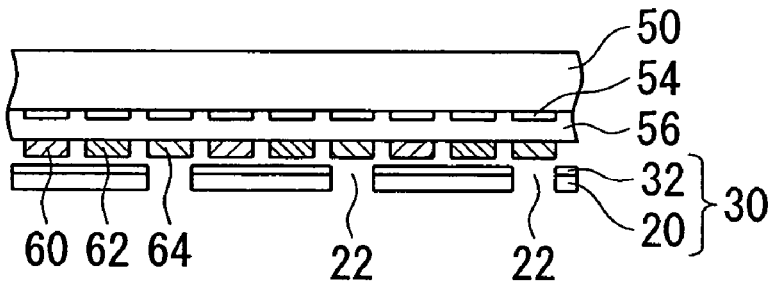

FIGS. 9A to 9C are figures showing a method of manufacturing a layer of luminescent material.

The luminescent material is for example an organic material, and, as a low molecule organic material, it may be an aluminum quinolinol complex ($Alq_3$), while, as a high molecule organic material, it may be polyparaphenyline vinylene (PPV). The manufacture of the layer of luminescent material may be performed by vapor deposition. For example, as shown in FIG. 9A, a red colored luminescent layer 60 is formed by making a film while patterning red colored luminescent material through the mask 30. As shown in FIG. 9B, the mask 30 is displaced, and a green colored luminescent layer 62 is formed by making a film while patterning green colored luminescent material. Furthermore, as shown in FIG. 9C, the mask 30 is again displaced, and a blue colored luminescent layer 64 is formed by making a film while patterning blue colored luminescent material. It should be understood that, because the mask member 20 which constitutes the screen is reinforced by the substrate 10, warping or bending thereof does not occur, and the repeatability of selective vapor deposition is high, so that the productivity is high. Furthermore, in the mask 30, a plurality of the apertures 12 are formed in the substrate 10, and a mask member 20 is positioned in correspondence to each of the apertures 12, so that each of the mask members 20 corresponds to a single EL device. In other words, it is possible to manufacture a plurality of EL devices all together by using the mask 30. Furthermore, it is possible to obtain the various EL devices separately by breaking up the glass substrate 50.

It should be understood that, although here the example of a luminescent layer has been taken and explained, it is also possible to perform vapor deposition of an electron transportation layer, an electron injection layer, a hole transportation layer, or a hole injection layer by using a mask of the present invention. In other words, when forming, between electrodes, a hole injection layer/a hole transportation layer/a luminescent layer/an electron transportation layer/an electron injection layer, it is possible to form respective layers using a vapor deposition method in which the masks of the present invention are employed.

Figure 10:
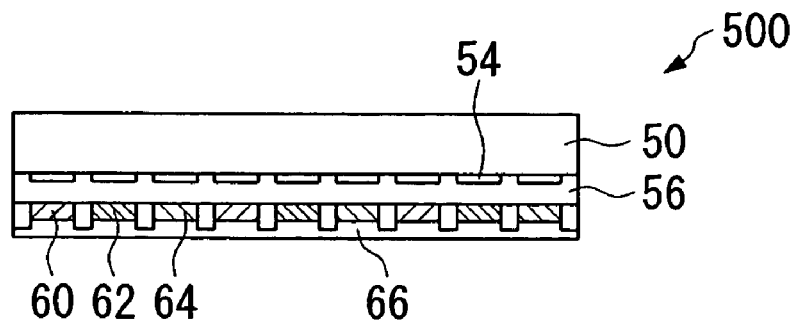
FIG. 10 is a figure showing an electro-optical device.

FIG. 10 is a figure showing an electro-optical device 500 which has been manufactured via the method described above of manufacturing a layer of luminescent material.

The electro-optical device 500 (for example, an organic EL device) includes a glass substrate 50, an electrode 54, a hole transportation layer 56, luminescent layers 60, 62, 64, and so on. An electrode 66 is formed above the luminescent layers 60, 62, and 64. The electrode 66 is, for example, the negative electrode. The electro-optical device 500 is taken advantage of as a display device (a display).

Figure 11:
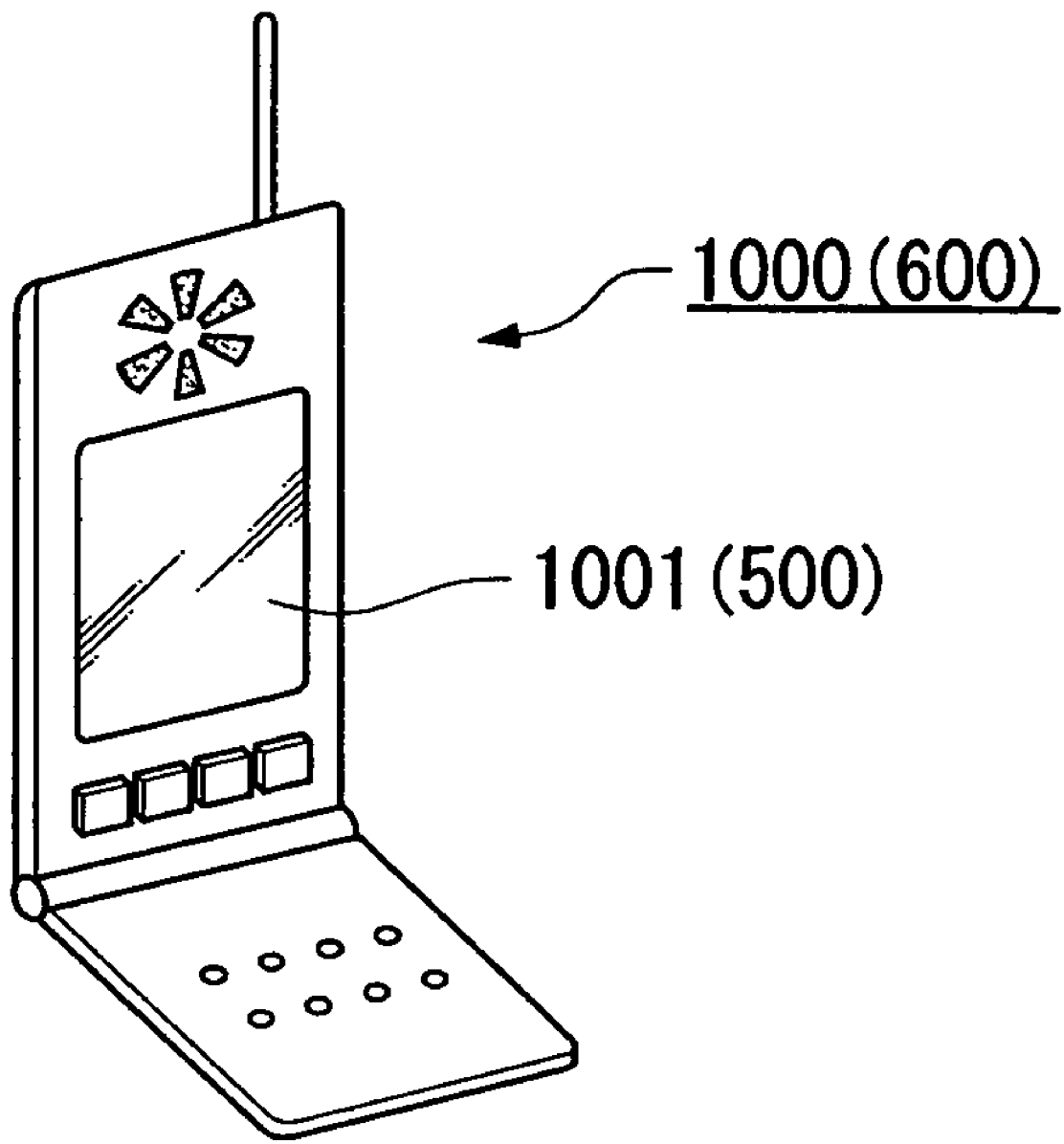
FIG. 11 is a figure showing an electronic device.

FIG. 11 is a figure showing an embodiment of an electronic device 600 of the present invention.

A portable telephone 1000 (an electronic device 600) includes a display section 1001 which is made up from an electro-optical device 500. As other examples of application, there are the case, with a wristwatch type electronic device, of including the electro-optical device 500 as a display section, or the case, with a portable type information processing device such as a word processor, a personal computer, or the like, of including the electro-optical device 500 as a display section, and the like. Since the electronic device 600, in this manner, includes the electro-optical device 500 as a display means, it is possible to implement a display of which the display contrast is high, and the product quality is excellent.

Furthermore it is possible to employ, as the material for the above described glass substrate, apart from glass, a transparent material like a plastic, such as polyolefin, polyester, polyacrylate, polycarbonate, polyethersulfone, polyetherketone, or the like.

Furthermore, as the material for the above described electrode (positive electrode), apart from ITO (Indium Tin Oxide), there may be employed an element such as aluminum (Al, gold (Au), silver (Ag), magnesium (Mg), nickel (Ni), zinc-vanadium (ZnV), indium (In), tin (Sn) or the like, or a compound or a mixture thereof, or an electrically conductive adhesive which includes a metal filler, or the like. The production of the electrode may desirably be performed by spattering, ion plating, or a vacuum vapor deposition method. It would be acceptable to form the picture element electrode using printing by a spin coater, a gravure coater, a knife coater or the like, screen printing, flexo printing, or the like.

Furthermore, as the method for forming the above described hole transportation layer, for example, it may be formed by vapor-depositing together a carbazole polymer and TPD (triphenyl compound) at a layer thickness of 10 to 1000 nm (desirably, 100 to 700 nm). As another method of formation, it is also acceptable, after having ejected upon a substrate a composition ink which includes the material of the hole injection or transportation layer, for example by an ink jet method, to perform a drying process and a heating process. It should be understood that, as the composition ink, it is possible to employ a material in which a mixture of a polythiophene derivative such as, for example, polyethylene dioxy thiophene or the like and polystyrene sulfonate or the like is dissolved in a polar solvent such as water or the like.

Furthermore, as the method for forming the above described electron transportation layer, for example, a method of superimposed layer formation by vapor deposition of a complex metallic compound made from a metal and an organic ligand, desirably $Alq_3$ (tris-(8-quinolinolate)-aluminum complex), $Znq_2$ (bis-(8-quinolinolate)-zinc complex), $Bebq_2$ (bis-(8-quinolinolate)-beryllium complex), Zn-BTZ (2-(o-hydroxyphenyl)-benzothiazole zinc), a perylene derivative or the like, may be utilized, so as to make a layer of thickness 10 to 1000 nm (desirably, 100 to 700 nm).

Furthermore, the above described electrode (negative electrode) may, for example, be made up from a layered structure, and, as the negative electrode layer lower portion, a metal whose work function is lower than the negative electrode layer upper portion, for example, calcium or the like, may be used, so as to be able to perform electron injection efficiently into the electron transportation layer or the luminescent layer. Furthermore, since the negative electrode layer upper portion protects the negative electrode layer lower portion, it is desirable for it to be made from some material whose work function is relatively larger than the negative electrode layer lower portion; for example, aluminum or the like may be used. It is desirable for this lower portion negative electrode layer and upper portion negative electrode layer to be formed by, for example, a vapor deposition method, a spattering method, or a CVD method or the like, and, in particular, formation by a vapor deposition method is desirable, from the point of view of preventing damage to the luminescent layer due to heat, ultraviolet light, an electron beam, or plasma.

Although preferred embodiments according to the present invention have been explained above with reference to the appended drawings, it need not be said that the present invention is not limited to these examples. The various shapes of the various structural members which are shown in the above described examples, and their combinations and the like, are only examples, and it is possible to make various alterations based upon design requirements and the like, within the scope of not departing from the gist of the present invention.

What is claimed is:

1. A mask, comprising:
a substrate in which an aperture is formed;
a mask member which, along with being formed with a plurality of through holes, is joined to said substrate in correspondence to said aperture; and
spacers which are sufficiently rigid not to deform when pressed so as to hold said substrate and said mask member with a predetermined gap between them, wherein:
said spacers consist of a plurality of spherical bodies having a diameter that is substantially the same as said predetermined gap, and
said spacers are provided between said substrate and said mask member, so that each of said spacers contacts both said substrate and said mask member.

2. A mask according to claim 1, wherein said spacers are disposed along with an adhesive in a junction region between said substrate and said mask member.

3. A mask according to claim 2, wherein said substrate includes a transparent material.

4. A mask according to claim 2, wherein the adhesive is photo-curing.

5. A mask according to claim 2, wherein the adhesive is disposed at an outer peripheral side of said mask member.

6. A method of manufacturing a layer of luminescent material, wherein, as a mask which is used when forming a layer of luminescent material by vapor deposition, there is used:
a mask according to claim 1.

* * * * *